US012562197B2

(12) United States Patent
Wang et al.

(10) Patent No.: US 12,562,197 B2
(45) Date of Patent: *Feb. 24, 2026

(54) HEADER CIRCUIT PLACEMENT IN MEMORY DEVICE

(71) Applicant: Taiwan Semiconductor Manufacturing Company, Ltd., Hsinchu (TW)

(72) Inventors: Po-Sheng Wang, Hsinchu (TW); Yangsyu Lin, New Taipei (TW); Kao-Cheng Lin, Taipei (TW); Cheng Hung Lee, Hsinchu (TW); Jonathan Tsung-Yung Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 149 days.

This patent is subject to a terminal disclaimer.

(21) Appl. No.: 18/595,035

(22) Filed: Mar. 4, 2024

(65) Prior Publication Data

US 2024/0203461 A1 Jun. 20, 2024

Related U.S. Application Data

(63) Continuation of application No. 18/088,216, filed on Dec. 23, 2022, now Pat. No. 11,923,034, which is a (Continued)

(51) Int. Cl.
*G11C 5/14* (2006.01)
*G11C 16/30* (2006.01)

(52) U.S. Cl.
CPC ................ *G11C 5/14* (2013.01); *G11C 16/30* (2013.01)

(58) Field of Classification Search
CPC ........... G11C 5/14; G11C 16/30; G11C 5/025; H10D 89/10
See application file for complete search history.

(56) References Cited

U.S. PATENT DOCUMENTS 6,396,087 B1 * 5/2002 Kitabayashi ........... H10D 89/10
257/207
8,817,528 B2 8/2014 Otto et al.
(Continued)

OTHER PUBLICATIONS

Non-Final Office Action on U.S. Appl. No. 18/088,216 DTD Jun. 23, 2023.
(Continued)

*Primary Examiner* — Khamdan N. Alrobaie
(74) *Attorney, Agent, or Firm* — Foley & Lardner LLP

(57) ABSTRACT

Disclosed herein are related to an integrated circuit including a semiconductor layer. In one aspect, the semiconductor layer includes a first region, a second region, and a third region. The first region may include a circuit array, and the second region may include a set of interface circuits to operate the circuit array. A side of the first region may face a first side of the second region along a first direction. The third region may include a set of header circuits to provide power to the set of interface circuits through metal rails extending along a second direction. A side of the third region may face a second side of the second region along the second direction. In one aspect, the first side extending along the second direction is shorter than the second side extending along the first direction, and the metal rails are shorter than the first side.

20 Claims, 10 Drawing Sheets

300

| Memory Array 310A | 330AA |
| | 335AA |
| | 330AB |
| | 335AB |
| | 330AC |
| | 335AC |
| | 330AD |
| | 335AD |
| Word Line Driver 320 | CNT 350 |
| Memory Array 310B | 330BD |
| | 335BD |
| | 330BC |
| | 335BC |
| | 330BB |
| | 335BB |
| | 330BA |
| | 335BA |

X
Y

Related U.S. Application Data continuation of application No. 17/461,210, filed on Aug. 30, 2021, now Pat. No. 11,538,507.

(56) References Cited

U.S. PATENT DOCUMENTS

| | | | | |
|---|---|---|---|---|
| 2008/0031030 | A1 | 2/2008 | Rajan et al. | |
| 2008/0037354 | A1 | 2/2008 | Liaw | |
| 2008/0082763 | A1 | 4/2008 | Rajan et al. | |
| 2014/0192583 | A1 | 7/2014 | Rajan et al. | |
| 2015/0170715 | A1* | 6/2015 | Seo .......................... | G11C 5/14 |
| | | | | 365/226 |
| 2017/0178719 | A1 | 6/2017 | Wu et al. | |
| 2020/0020361 | A1 | 1/2020 | Jain et al. | |
| 2021/0241811 | A1 | 8/2021 | Yeh et al. | |
| 2021/0241824 | A1 | 8/2021 | Fujiwara et al. | |
| 2022/0130433 | A1 | 4/2022 | Kwak | |

OTHER PUBLICATIONS

Notice of Allowance on U.S. Appl. No. 17/461,210 DTD Sep. 1, 2022.
Notice of Allowance on U.S. Appl. No. 18/088,216 DTD Oct. 31, 2023.

* cited by examiner

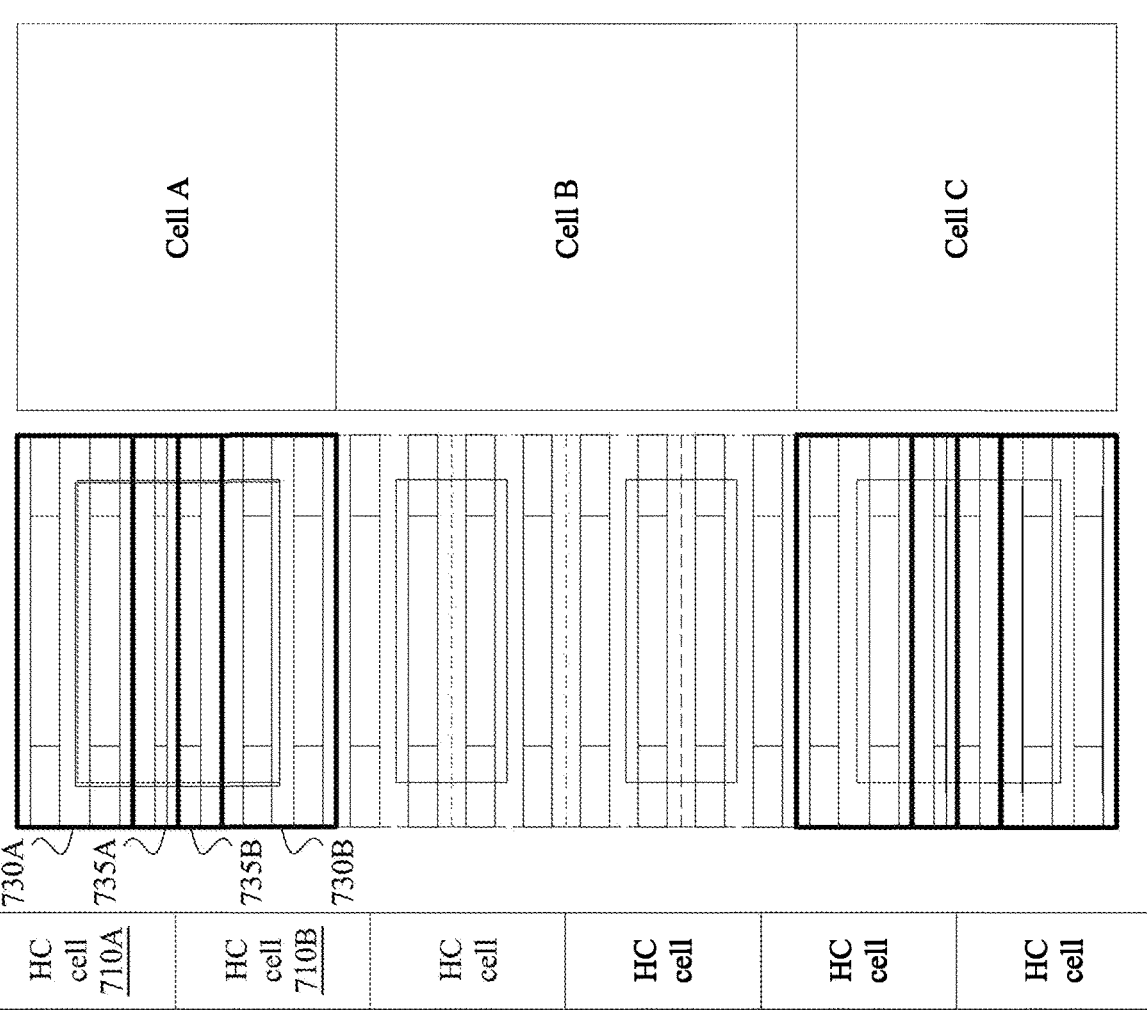
Fig. 7
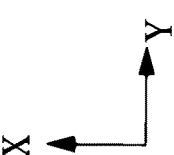

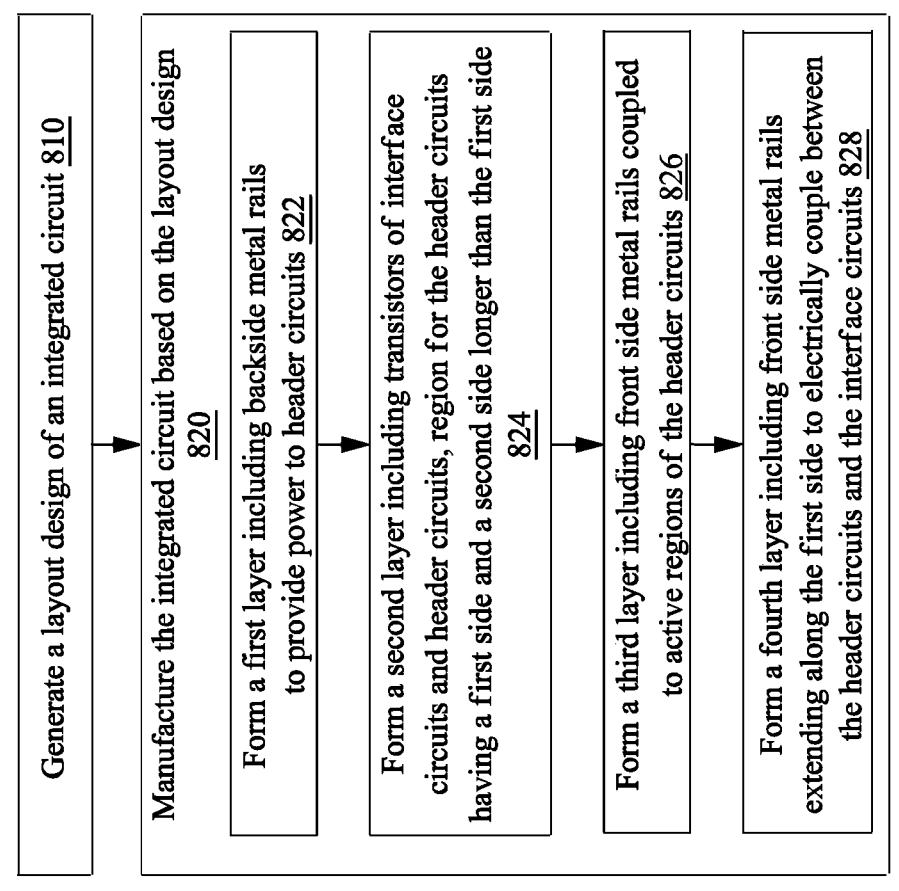

800

Generate a layout design of an integrated circuit 810

Manufacture the integrated circuit based on the layout design 820

Form a first layer including backside metal rails to provide power to header circuits 822

Form a second layer including transistors of interface circuits and header circuits, region for the header circuits having a first side and a second side longer than the first side 824

Form a third layer including front side metal rails coupled to active regions of the header circuits 826

Form a fourth layer including front side metal rails extending along the first side to electrically couple between the header circuits and the interface circuits 828

Fig. 8

HEADER CIRCUIT PLACEMENT IN MEMORY DEVICE

CROSS-REFERENCE TO RELATED APPLICATION

This application is a continuation of U.S. patent application Ser. No. 18/088,216, filed Dec. 23, 2022, which is a continuation of U.S. patent application Ser. No. 17/461,210, filed Aug. 30, 2021. The entire disclosures of U.S. patent application Ser. No. 18/088,216 and U.S. patent application Ser. No. 17/461,210 are incorporated herein by reference for all purposes.

BACKGROUND

Developments in electronic devices, such as computers, portable devices, smart phones, internet of thing (IoT) devices, etc., have prompted increased demands for memory devices. In general, memory devices may be volatile memory devices and non-volatile memory devices. Volatile memory devices can store data while power is provided but may lose the stored data once the power is shut off. Unlike volatile memory devices, non-volatile memory devices may retain data even after the power is shut off but may be slower than the volatile memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7 is a diagram of header circuits to provide power to an interface circuit, in accordance with one embodiment.

FIG. 8 is a flowchart of a method of manufacturing an integrated circuit, in accordance with some embodiments.

DETAILED DESCRIPTION

Figure 1:
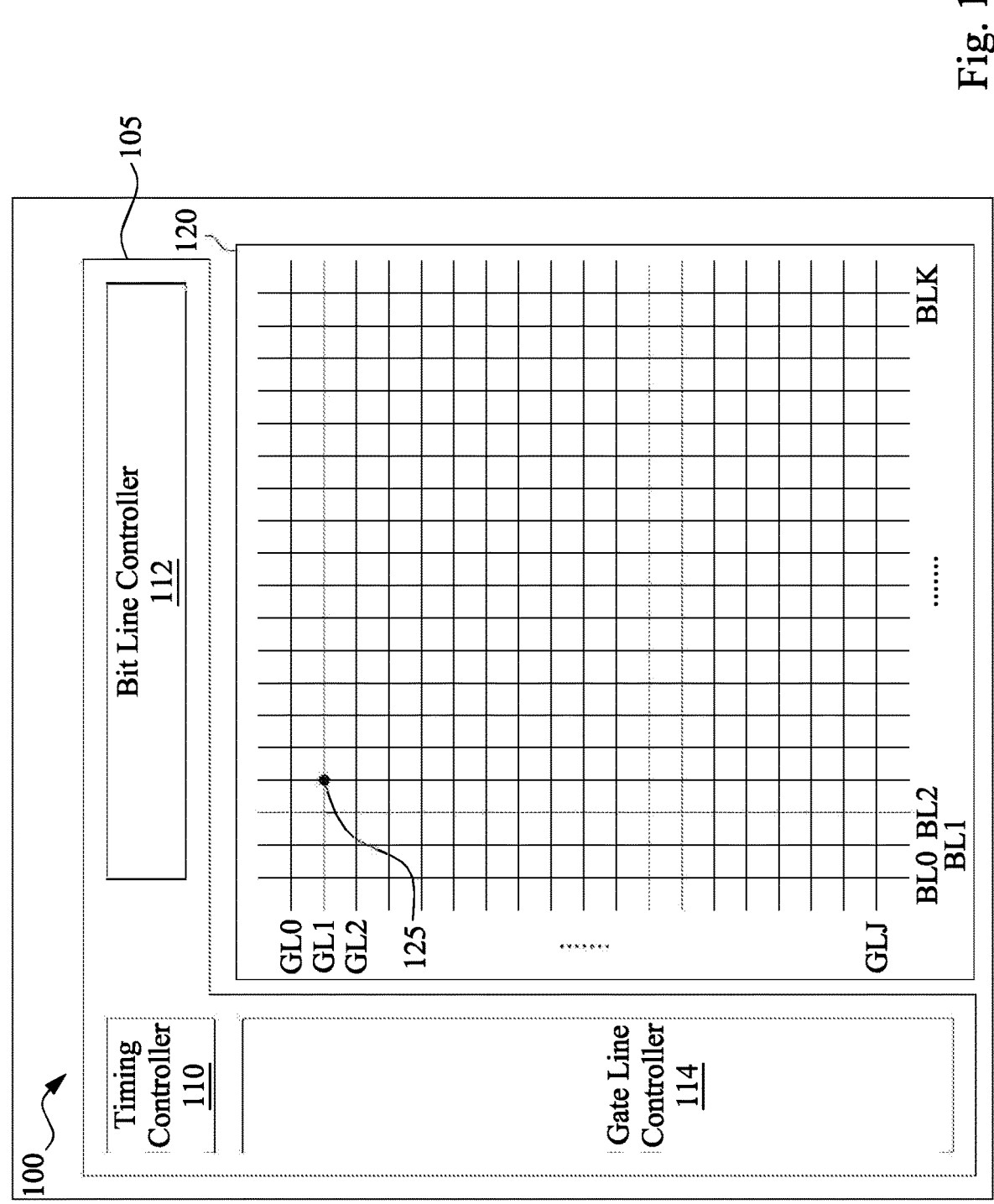
FIG. 1 is a diagram of a memory system, in accordance with one embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Disclosed herein are related to placements of header circuits in an integrated circuit. In one aspect, the integrated circuit includes a backside metal layer (or a backside power layer), a semiconductor layer, and a front side metal layer. The backside metal layer may include a set of metal rails. The semiconductor layer is disposed above the backside metal layer along a first direction. The semiconductor layer may include a first region, a second region, and a third region. The first region may include active regions of transistors to form a circuit array. The circuit array may be a memory array including memory cells. The second region may include active regions of transistors to form a set of interface circuits to operate the circuit array. An active region is a semiconductor structure having either n-type or p-type doping. A side of the first region may face a first side of the second region along a second direction perpendicular to the first direction. The third region may include active regions of transistors to form a set of header circuits to provide power from the set of metal rails to the set of interface circuits. A side of the third region may face a second side of the second region along a third direction orthogonal to the first direction and the second direction. The front side metal layer is disposed above the semiconductor layer along the first direction. The front side metal layer may include another set of metal rails to electrically connect the set of interface circuits. Metal rails on the front side of the active regions may be referred to as "front side metal rails," where metal rails on a backside of the active regions may be referred to as "backside metal rails."

Advantageously, the header circuits disclosed herein can provide power to the interface circuits with reduced power loss. The header circuits may receive power from the backside metal rails. The backside metal rails under the active regions may have a mesh structure with low resistance and high capacitance, such that the header circuits may receive power with low power loss through the backside metal rails. Moreover, the header circuits may be disposed along the second side of the second region, where the second side may be longer than the first side of the second region. The header circuits may provide power to the interface circuits through metal rails extending in parallel with the first side of the second region. Accordingly, the metal rails extending in parallel with the first side of the second region may have a shorter length than metal rails extending in parallel with the second side of the second region. Hence, the metal rails extending in parallel with the first side of the second region may have lower resistances than resistances of metal rails extending along the second side of the second region. By reducing resistances of the metal rails, power loss from the head circuits to interface circuits in the second region can be reduced.

In one aspect, the header circuits disclosed herein can achieve area efficiency. Different header circuits may provide different power or voltages to different portions of the interface circuits. Different header circuits may be elongated in parallel with the second side of the second region, and share a same well structure (e.g., N-well). By sharing the same well structure, the header circuits may be disposed in a compact form to achieve area efficiency.

FIG. 1 is a diagram of a memory system 100, in accordance with one embodiment. In some embodiments, the memory system 100 includes a memory controller 105 and a memory array 120. The memory array 120 may include a plurality of storage circuits or memory cells 125 arranged in two- or three-dimensional arrays. Each memory cell 125 may be connected to a corresponding gate line GL (or a word line WL) and a corresponding bit line BL. The memory controller 105 may write data to or read data from the memory array 120 according to electrical signals through gate lines GL and bit lines BL. In other embodiments, the memory system 100 includes more, fewer, or different components than shown in FIG. 1.

The memory array 120 is a hardware component that stores data. In one aspect, the memory array 120 is embodied as a semiconductor memory device. The memory array 120 includes a plurality of memory cells 125. The memory array 120 includes gate lines GL0, GL1 . . . GLJ, each extending in a first direction (e.g., X-direction) and bit lines BL0, BL1 . . . BLK, each extending in a second direction (e.g., Y-direction). The gate lines GL and the bit lines BL may be conductive metals or conductive rails. In one aspect, each memory cell 125 is connected to a corresponding gate line GL and a corresponding bit line BL, and can be operated according to voltages or currents through the corresponding gate line GL and the corresponding bit line BL. In one aspect, each memory cell 125 may be a ferroelectric field-effect transistor (FeFET), resistive memory cell, a non-volatile memory cell, or a volatile memory cell. In some embodiments, the memory array 120 includes additional lines (e.g., select lines, reference lines, reference control lines, power rails, etc.).

The memory controller 105 is a hardware component that controls operations of the memory array 120. In some embodiments, the memory controller 105 includes a bit line controller 112, a gate line controller 114, and a timing controller 110. In one configuration, the gate line controller 114 is a circuit that provides a voltage or a current through one or more gate lines GL of the memory array 120, and the bit line controller 112 is a circuit that provides or senses a voltage or current through one or more bit lines BL and/or select lines SL of the memory array 120. In one configuration, the timing controller 110 is a circuit that provides control signals or clock signals to synchronize operations of the bit line controller 112 and the gate line controller 114. The bit line controller 112 may be connected to bit lines BL and/or select lines SL of the memory array 120, and the gate line controller 114 may be connected to gate lines GL of the memory array 120. In one example, to write data to a memory cell 125, the gate line controller 114 provides a voltage or current to the memory cell 125 through a gate line GL connected to the memory cell 125, and the bit line controller 112 applies a bias voltage to the memory cell 125 through a bit line BL and/or a select line SL connected to the memory cell 125. In one example, to read data from a memory cell 125, the gate line controller 114 provides a voltage or current to the memory cell 125 through a gate line GL connected to the memory cell 125, and the bit line controller 112 senses a voltage or current corresponding to data stored by the memory cell 125 through a bit line BL and/or a select line SL connected to the memory cell 125. In some embodiments, the memory controller 105 includes more, fewer, or different components than shown in FIG. 1.

Figure 2:
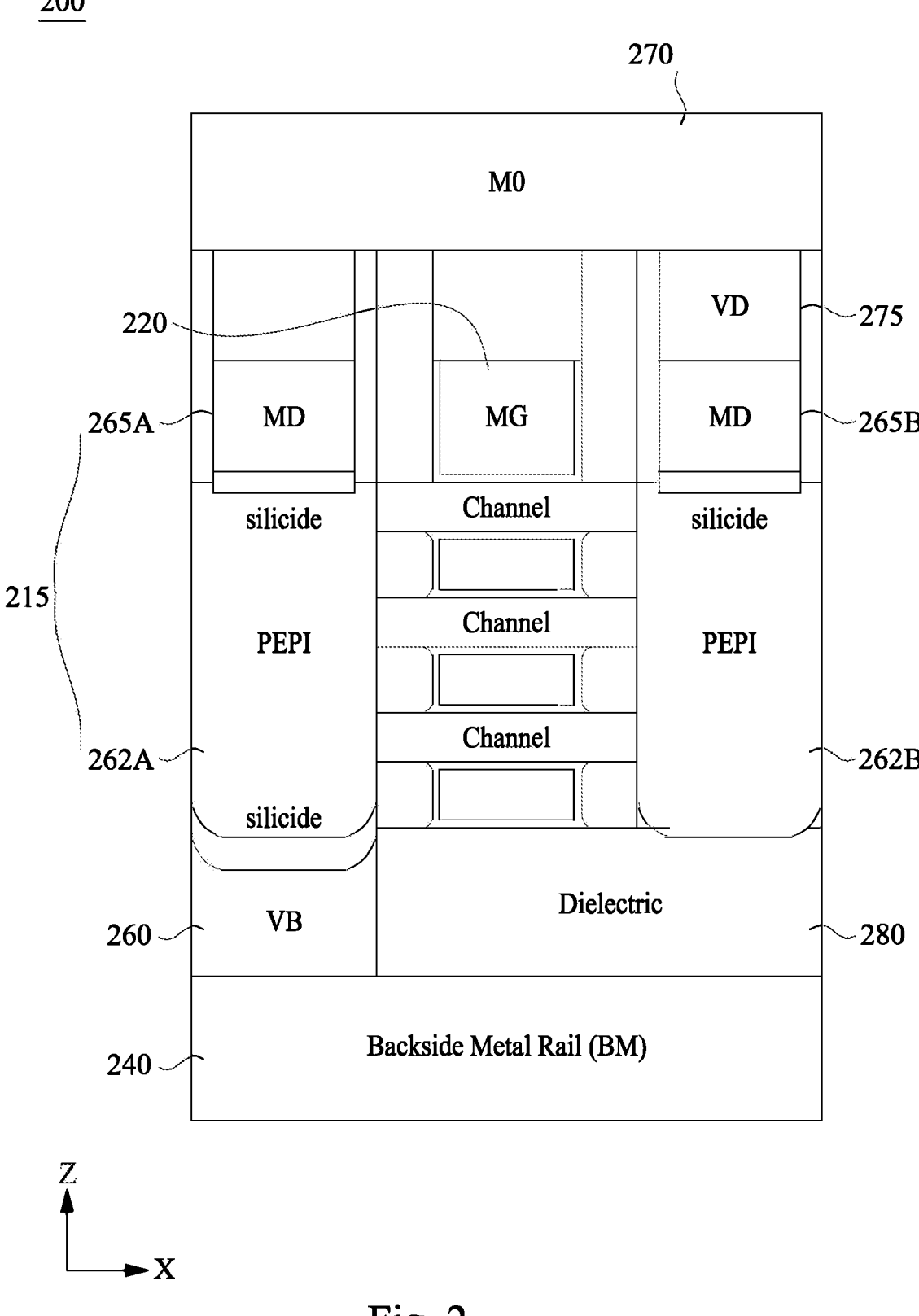
FIG. 2 is a cross-section diagram of a portion of an integrated circuit including a backside metal rail, in accordance with one embodiment.

FIG. 2 is a cross-section diagram of a portion of an integrated circuit 200 including backside power rails, in accordance with one embodiment. In one aspect, the integrated circuit 200 includes a transistor 215 implemented in the memory controller 105 (e.g., timing controller 110, bit line controller 112, gate line controller 114) or the memory array 120 of FIG. 1. In some embodiments, the integrated circuit 200 includes a backside metal rail layer BM including backside metal rails 240. Above the backside metal rail layer BM along the Z-direction, a contact layer VB including via contacts 260 can be formed. Above the contact layer VB along the Z-direction, an epitaxial layer EPI including active regions (or source/drain regions) 262A, 262B can be formed. Active regions 262A, 262B and a gate structure 220 may constitute the transistor 215. Above the epitaxial layer EPI along the Z-direction, a conductive layer MD including MD regions 265A, 265B can be formed. Above the conductive layer MD along the Z-direction, a contact layer VD including a via contact 275 can be formed. Above the contact layer VD along the Z-direction, a front side metal layer M0 including a front side metal rail 270 can be formed. In one aspect, power can be provided to the active regions through backside metal rails, where signals can be provided through front side metal rails. Although the transistor 215 shown in FIG. 2 is a gate all around field effect transistor (GAAFET), different transistors may be implemented (e.g., metal oxide semiconductor field effect transistor (MOSFET), fin field effect transistor (FinFET), etc.).

In one aspect, the backside metal rails can provide several advantages. In one example, the integrated circuit 200 can be formed in a smaller area, because a number of front side metal rails (e.g., M0 rails or higher-level metal rails) and via contacts can be reduced. For example, by implementing backside metal rails, a gate density can improve compared to not implementing the backside metal rails. Moreover, in one example, MD region or gate region for forming transistors can have more regular or consistent shapes, such that characteristics of the transistors can be more consistent. In addition, the backside metal rails under the active regions may have a mesh structure with low resistance and high capacitance to provide power with low loss.

In one aspect, the transistor 215 formed as shown in FIG. 2 includes dielectric materials between the active region 262B and the backside metal rail 240, instead of a bulk region. By obviating a bulk region, different transistors for providing different power levels can share a well structure (e.g., N-well). By sharing a well structure, different transistors or circuits for providing different power levels can be formed in a compact manner to achieve area efficiency.

Figure 3:
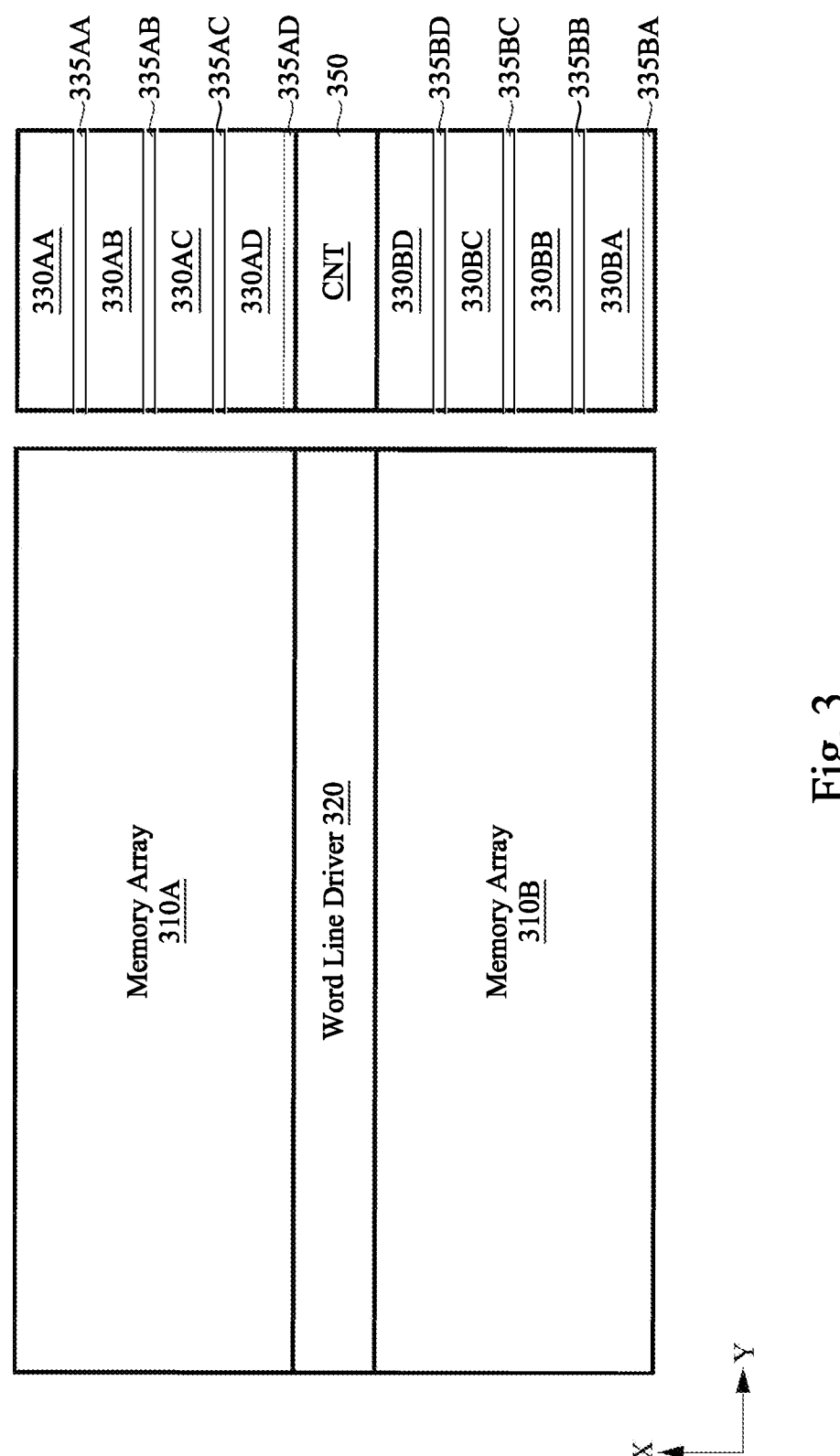
FIG. 3 is a diagram of header circuits to provide power to interface circuits, in accordance with one embodiment.

FIG. 3 is a diagram of a portion of an integrated circuit 300, in accordance with one embodiment. In some embodiments, the integrated circuit 300 may be embodied as the memory system 100 or a part of the memory system 100 including the memory array 120 and the memory controller 105. In some embodiments, the integrated circuit 300 includes first regions 310A, 310B, second regions 330AA . . . 330AD, 330BA . . . 330BD, third regions 335AA . . . 335AD, 335BA . . . 335BD, a fourth region 320, and a fifth region 350. The first regions 310A, 310B may include or correspond to the memory array 120 of FIG. 1. The second regions 330AA . . . 330AD, 330BA . . . 330BD include or correspond to interface circuits (e.g., bit line controller 112). The interface circuits may include drive circuits, amplifiers, multiplexers, etc. to operate or configure circuit array or memory cells. The third regions 335AA . . . 335AD, 335BA . . . 335BD may include or correspond to header circuits to provide power to the interface circuits. The header circuits may include switches or transistors (e.g., P-type transistors) that can selectively couple or decouple between power rails and the interface circuits according to a control signal, for example, from the timing controller 110. The interface circuits and the header circuits may be embodied as or correspond to the bit line controller 112 of FIG. 1. The fourth region 320 may include or correspond to the gate line controller 114 of FIG. 1. The fifth region 350 may include or correspond to the timing controller 110 of FIG. 1. In some embodiments, the integrated circuit 300 includes more, fewer, or different components than shown in FIG. 1.

In one configuration, the first region 310B, the fourth region 320, and the first region 310A are disposed along an X-direction in that sequence. In one configuration, the regions 335AD, 330AD, 335AC, 330AC, 335AB, 330AB, 335AA, 330AA may be disposed along the X-direction in that sequence. Each of the regions 335AD, 330AD, 335AC, 330AC, 335AB, 330AB, 335AA, 330AA may have a first side facing an opposite direction of a Y-direction, a second side facing the X-direction, and a third side facing an opposite direction of the X-direction. The first region 310A may include a side facing the first sides of the second regions 330AA . . . 330AD and third regions 335AA . . . 335AD along the Y-direction. A length of the side of the first region 310A may be equal to a sum of lengths of the first sides of the second regions 330AA . . . 330AD and third regions 335AA . . . 335AD. In one aspect, the third regions 335AA . . . 335AD extend along the Y-direction, such that header circuits in the third regions 335AA . . . 335AD may provide power to the interface circuits in the second regions 330AA . . . 330AD through shorter metal rails extending along the X-direction. The header circuits can be formed along the Y-direction, because the header circuits can receive power through backside metal rails without much power loss. Moreover, the header circuits can provide power to interface circuits through metal rails extending along the X-direction rather than longer metal rails extending along the Y-direction. By avoiding longer metal rails extending along the Y-direction, power loss due to the longer metal rails can be obviated. In one aspect, the regions 330BA . . . 330BD, 335BA . . . 335BD are disposed in a similar manner as the regions 330AA . . . 330AD, 335AA . . . 335AD, but in an opposite direction with respect to the region 350. Thus, detailed description of duplicated portion thereof is omitted herein for the sake of brevity. By implementing a portion of the integrated circuit 300 as shown in FIG. 3, the regions 310, 320, 330, 335, 350 can be formed symmetrically.

Figure 4:
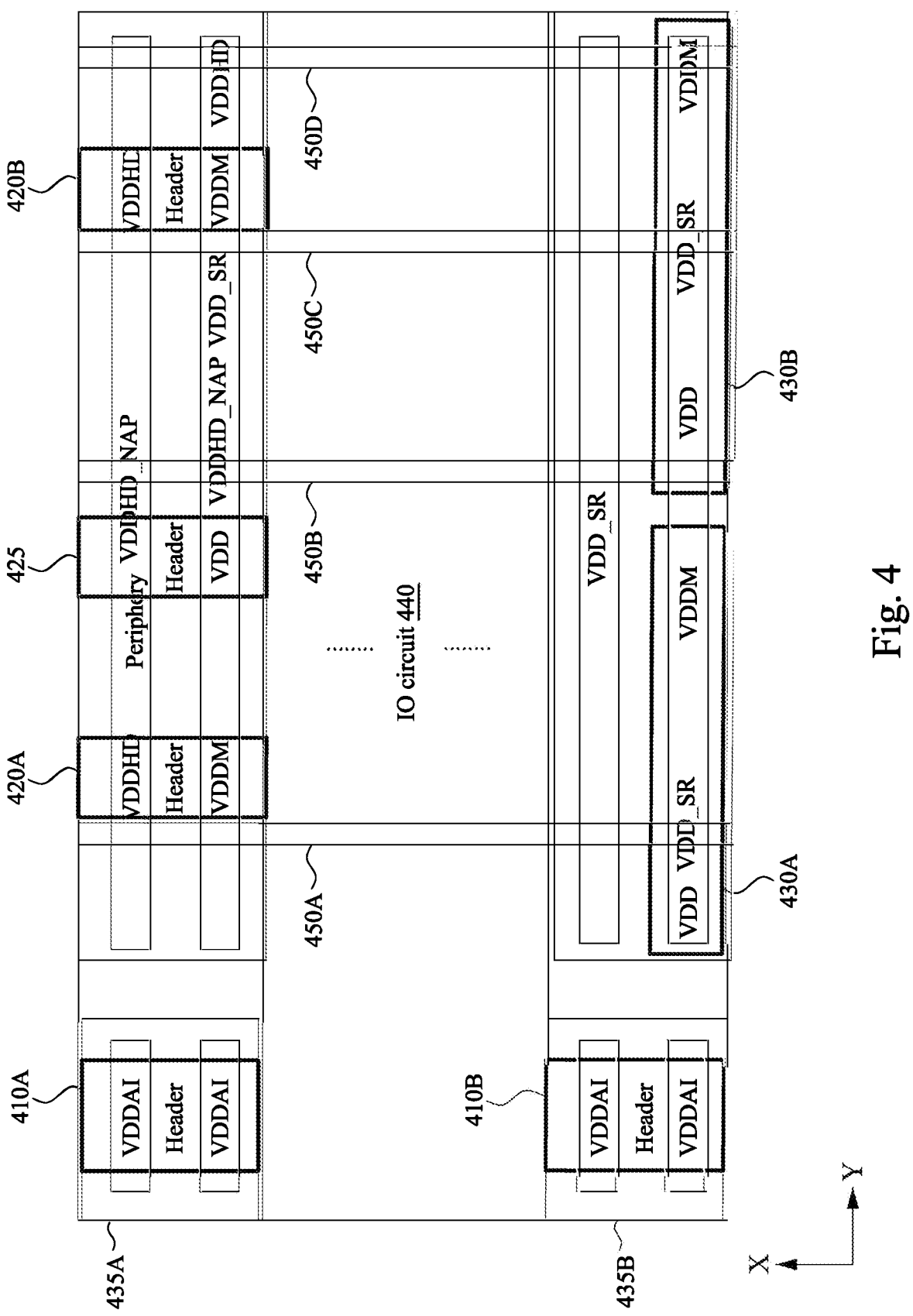
FIG. 4 is a diagram of header circuits to provide power to an interface circuit, in accordance with one embodiment.

FIG. 4 is a diagram of a portion of an integrated circuit 400, in accordance with one embodiment. In some embodiments, the integrated circuit 400 may be embodied as the integrated circuit 300 or a part of the integrated circuit 300 including an interface circuit in the region 330 and a header circuit in the region 335 of the memory controller 105 (e.g., bit line controller 112). In some embodiments, the integrated circuit 400 includes regions 435A, 435B, 440. The regions 435A, 435B may be the region 335 corresponding to a set of header circuits. The region 440 may be the region 330 corresponding to interface circuits. In one configuration, the regions 435B, 440, 435A are disposed along the X-direction in that sequence. In one aspect, the integrated circuit 400 operates based on different voltages or power domains provided from the set of header circuits in the regions 435A, 435B.

In one aspect, the region 435A includes sub-regions 410A, 420A, 425, 420B. The sub-region 410A may include or correspond to first header circuits to provide a first voltage VDDAI. The regions 420A, 420B may include or correspond to second header circuits to provide a second voltage VDDM. The region 425 may include or correspond to a header circuit to provide a third voltage VDD. The regions 410A, 420A, 425, 420B may be disposed along the Y-direction. The regions 410A, 420A, 425, 420B may include transistors sharing a well structure (e.g., N-well), such that the regions 410A, 420A, 425, 420B can be arranged in a compact form.

In one aspect, the region 435B includes sub-regions 410B, 430A, 430B. The region 410 may include or correspond to first header circuits to provide the first voltage VDDAI. The regions 430A, 430B may include or correspond to switch rail header circuits to selectively provide one of the third voltage VDD or the second voltage VDDM as output voltage VDD_SR. The regions 410B, 430A, 430B may include transistors sharing a well structure (e.g., N-well), such that the regions 410B, 430A, 430B can be formed in a compact area.

In one aspect, the power from the header circuits can be provided through metal rails 450A-450D. The metal rails 450A-450D may be backside metal rails (e.g., M-1, M-2), front side metal rails (e.g., MD, M0-M3) or a combination of them. The metal rails 450A-450D may extend along the X-direction in parallel with the first side of the region 440. By implementing the header circuits in the regions 435A, 435B extending along the Y-direction, metal rails 450A-450D extending along the X-direction can be implemented to provide power to interface circuits in the region 440. Accordingly, long metal rails extending along the Y-direction can be obviated, such that power loss due to resistances of the metal rails can be reduced. Reducing resistances of metal rails may also allow improved operation speed and power savings.

Figure 5:
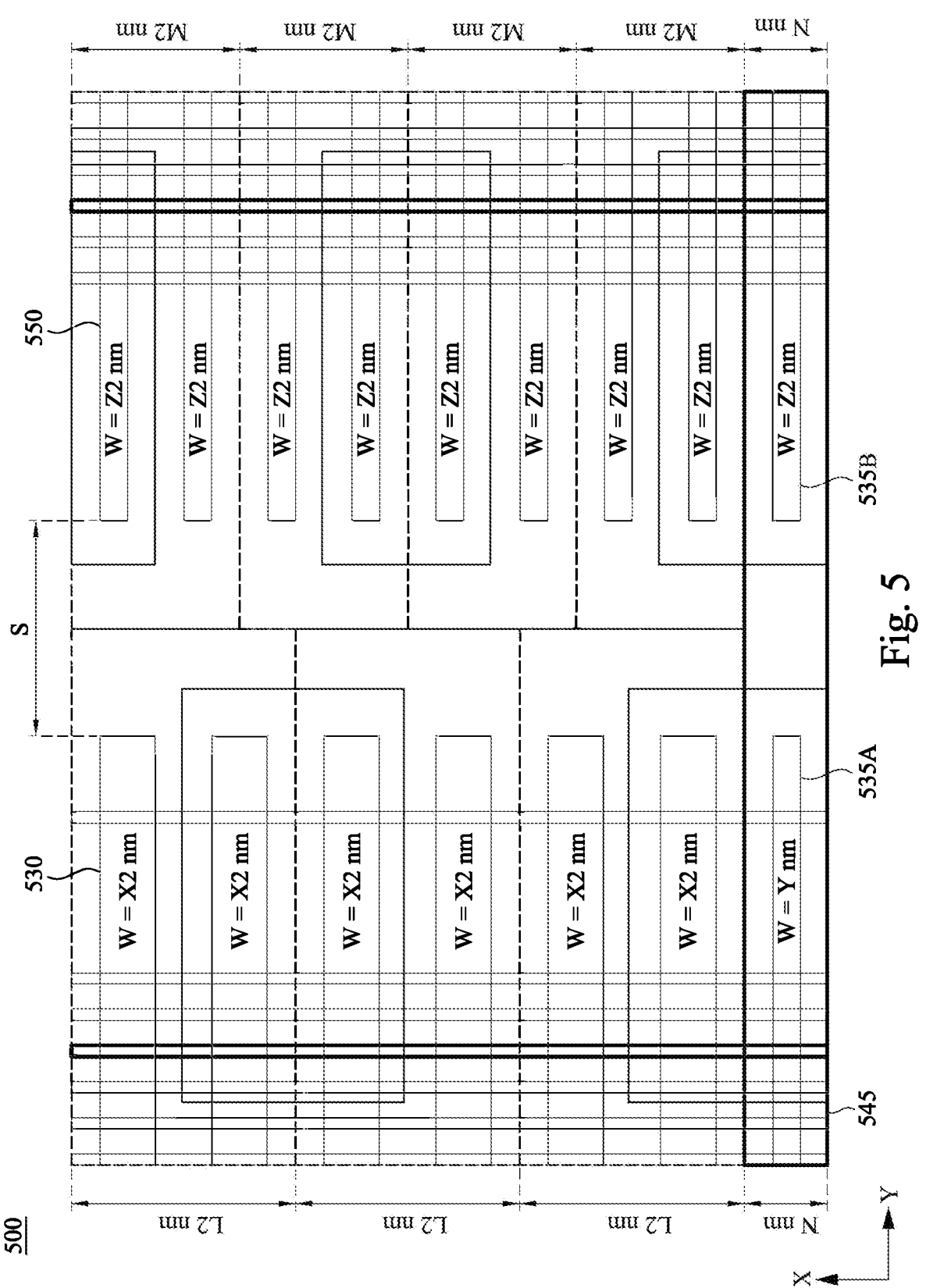
FIG. 5 is a diagram of header circuits to provide power to an interface circuit, in accordance with one embodiment.

FIG. 5 is a diagram of a portion of an integrated circuit 500, in accordance with one embodiment. In some embodiments, the integrated circuit 500 may be embodied as the integrated circuit 300 or a part of the integrated circuit 300 including an interface circuit in the region 330 and a header circuit in the region 335 of the memory controller 105 (e.g., bit line controller 112). In some embodiments, the integrated circuit 500 includes active regions 530, 550, 535A, 535B for forming transistors. The active regions 530, 550, 535A, 535B may extend along the Y-direction. For example, each region 530 has a width X2 along the Y-direction, and each region 550 has a width Z2 along the Y-direction. For example, the region 535A has a width Y along the Y-direction, and the region 535B has a width Y along the Y-direction. The active regions 530, 550, 535A, 535B may occupy different lengths along the X-direction. For example, two adjacent regions 530 occupy a length L2 along the X-direction, and two adjacent regions 550 occupy a length M2 along the X-direction. For example, each of the regions 535A, 535B occupies a length N along the X-direction. The active regions 530 may include or correspond to transistors for forming an interface circuit operating in a first power domain, and the active regions 550 may include or correspond to transistors for forming an interface circuit operating in a second power domain. The active region 535A may include or correspond to transistors for forming a set of header circuits to provide power to the active region 530. The active region 535B may include or correspond to transistors for forming a set of header circuits or switch rail header circuits to provide power to the active region 550. In one aspect, the active regions 530 are separated from the active regions 550 by a separation distance S along the Y-direction. In one aspect, the active regions 535A, 535B are separated from each other by the separation distance S along the Y-direction. The separation distance may be 6×cpp (polypitch).

In one aspect, the active regions 530, 550, 535A, 535B in different power domains do not have a bulk as described above with respect to FIG. 2. Accordingly, the active regions 530, 550, 535A, 535B can share a same well structure (e.g., N-well), despite operating in different power domains. By sharing the well structure, the integrated circuit 500 can be implemented in a compact manner to achieve area efficiency. For example, implementing the region 545 for header circuits including the regions 535A, 535B extending along the Y-direction with metal rails extending along the X-direction can reduce area by 2% compared to implementing a region for header circuits extending along the X-direction with metal rails extending along the Y-direction. Moreover, implementing the region 545 for header circuits extending along the Y-direction with metal rails extending along the X-direction can improve operating speed by 3~7% compared to implementing a region for header circuits extending along the X-direction with metal rails extending along the Y-direction.

Figure 6:
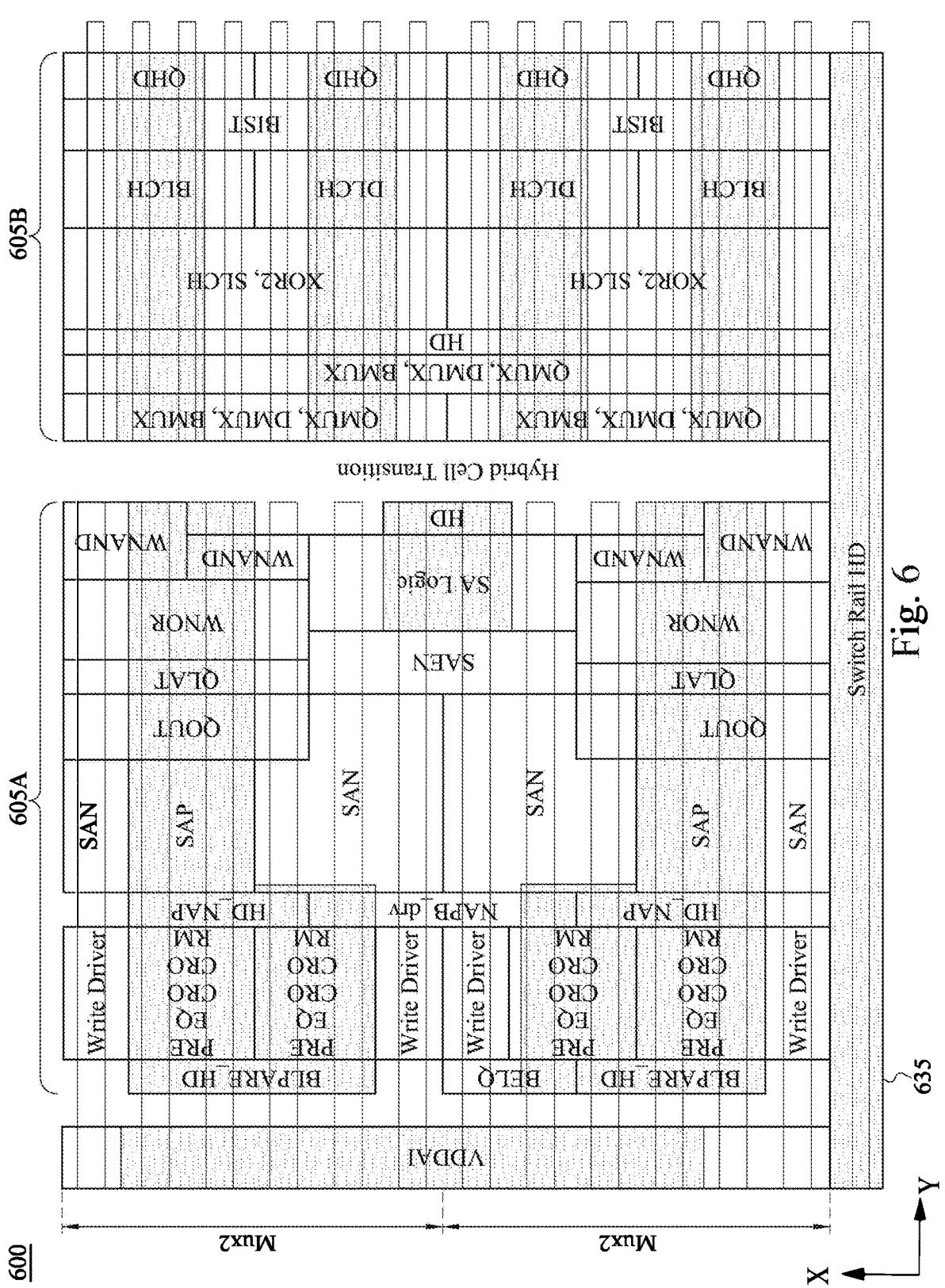
FIG. 6 is a diagram of header circuits to provide power to an interface circuit, in accordance with one embodiment.

FIG. 6 is a diagram of a portion of an integrated circuit 600, in accordance with one embodiment. In some embodiments, the integrated circuit 600 may be embodied as the integrated circuit 300 or a part of the integrated circuit 300 including an interface circuit in the region 330 and a header circuit in the region 335 of the memory controller 105 (e.g., bit line controller 112). The integrated circuit 600 may include regions 605A, 605B, 635. The regions 605A, 605B may be the region 330 corresponding to interface circuits. The region 635 may be the region 335 corresponding to a set of header circuits or switch rail header circuits. In one aspect, interface circuits in the region 605A operate according to a first power domain, and interface circuits in the region 605B operate according to a second power domain. Header circuits or switch rail header circuits in the region 635 may extend along the Y-direction and provide different power levels or voltages to the interface circuits in the regions 605A, 605B.

FIG. 7 is a diagram of a portion of an integrated circuit 700, in accordance with one embodiment. In some embodiments, the integrated circuit 700 may be embodied as the integrated circuit 300 or a part of the integrated circuit 300 including an interface circuit in the region 330 and a header circuit in the region 335 of the memory controller 105 (e.g., bit line controller 112). In some embodiments, the integrated circuit 700 includes regions 710A, 710B, 730A, 730B, 735A, 735B. The regions 710A, 710B may be the regions 310A, 310B corresponding to memory arrays. The regions 730A, 730B may be the regions 330AA-330AD, 330BA-330BD corresponding to interface circuits. The regions 735A, 735B may be the regions 335AA-335AD, 335BA-335BD corresponding to header circuits or switch rail header circuits. In one aspect, the regions 730A, 735A and the regions 730B, 735B are disposed in a symmetrical manner, such that header circuits in the regions 735A, 735B can be adjacent to each other. By placing the header circuits adjacent to each other, metal rails connected to the header circuits can be shared to further lower resistances and increase capacitances of the metal rails, thereby reducing power loss due to the metal rails.

FIG. 8 is a flowchart of a method 800 of forming or manufacturing an integrated circuit in accordance with some embodiments. It is understood that additional operations may be performed before, during, and/or after the method 800 depicted in FIG. 8. In some embodiments, the method 800 is usable to form an integrated circuit according to various layout designs as disclosed herein.

In operation 810 of the method 800, a layout design of an integrated circuit (e.g., 300, 400, 500, 600, 700) is generated. The operation 810 is performed by a processing device (e.g., processor 902 of FIG. 9) configured to execute instructions for generating a layout design. In one approach, the layout design is generated by placing layout designs of one or more standard cells through a user interface. In one approach, the layout design is automatically generated by a processor executing a synthesis tool that converts a logic design (e.g., Verilog) into a corresponding layout design. In some embodiments, the layout design is rendered in a graphic database system (GDSII) file format.

In operation 820 of the method 800, the integrated circuit is manufactured based on the layout design. In some embodiments, the operation 820 of the method 800 comprises manufacturing at least one mask based on the layout design, and manufacturing the integrated circuit based on the at least one mask. In one approach, the operation 820 includes operations 822, 824, 826, 828.

In operation 822, a first layer (e.g., BM layer) including a first metal rail (e.g., backside metal rail) is formed. The first metal rail may be configured to provide power from a power source (e.g., battery or voltage regulator) to header circuits.

In operation 824, a second layer (e.g., EPI layer or semiconductor layer) including active regions of transistors of interface circuits (e.g., bit line controller 112) and header circuits is formed. Interface circuits may exchange data or signal with a memory array (e.g., memory array 120). Header circuits may receive power from a power source and provide power to the interface circuits. In one configuration, the memory array is formed in a first region (e.g., 310), the interface circuits are formed in a second region (e.g., 330, 440, 605, 730), and the header circuits are formed in a third region (e.g., 335, 435, 635, 735). The third region may have first side and a second side longer than the first side. The first side may extend along the X-direction and the second side may extend along the Y-direction. In one aspect, the second layer is formed above the first layer along a direction (e.g., Z-direction). In one approach, a first contact layer (e.g., VB layer) including one or more via contacts can be formed between the first layer and the second layer. The one or more via contacts in the first contact layer (e.g., VB layer) may electrically couple the first metal rail (e.g., backside metal rail) and active regions of transistors in the EPI layer.

In operation 826, a third layer (e.g., MD layer) including front side metal rails (e.g., MD regions) is formed above the second layer along the direction (e.g., Z-direction). In some embodiments, the MD region is directly coupled to the active regions of the transistors of the header circuits. The MD regions may protect the active regions. MD regions may also provide electrical signals (e.g., voltage or current) to the active regions of transistors.

In operation 828, a fourth layer (e.g., M0 layer) including front side metal rails (e.g., M0 rails) is formed above the third layer along the direction (e.g., Z-direction). The front side metal rails (e.g., M0 rails) in the fourth layer may extend in parallel with the first side of the third region or the second region. The first side metal rails (e.g., M0 rails) in the fourth layer may electrically couple between the header circuits and the interface circuits. In one approach, a second contact layer (e.g., VD layer) including one or more via contacts can be formed between the third layer and the fourth layer. The one or more via contacts in the second contact layer (e.g., VD layer) may electrically couple the MD region and the M0 rail. In one aspect, power can be provided to the active regions from a power source (e.g., battery or voltage regulator) through backside metal rails, where signals (e.g., data and/or clock signals) can be provided through front side metal rails. In some embodiments, power can be provided from the header circuit to the interface circuit through the front side metal rails (e.g., M0 rails) in the fourth layer. In some embodiments, different metal rails (e.g., backside metal rails or front side metal rails in different layers) may be implemented to provide power from the header circuit to the interface circuit.

In one aspect, the semiconductor layer may include a first region (e.g., 310), a second region (e.g., 330, 440, 605, 730), and a third region (e.g., 335, 435, 635, 735). The first region may include active regions of transistors to form a circuit array. The circuit array may be a memory array including memory cells. The second region may include active regions of transistors to form a set of interface circuits to operate the circuit array. A side of the first region may face a first side of the second region along a second direction perpendicular to the first direction. The third region may include active regions of transistors to form a set of header circuits to provide power from the set of metal rails to the set of interface circuits. A side of the third region may face a second side of the second region along a third direction orthogonal to the first direction and the second direction. The front side metal layer is disposed above the semiconductor layer along the first direction. The front side metal layer may include another set of metal rails to electrically connect the set of interface circuits (e.g., 300, 400, 500, 600, 700).

Advantageously, the header circuits disclosed herein can provide power to the interface circuits with reduced power loss. The header circuits may receive power from the backside metal rails. The backside metal rails under the active regions may have a mesh structure with low resistance and high capacitance, such that the header circuits may receive power with low power loss through the backside metal rails. Moreover, the header circuits may be disposed along the second side of the second region, where the second side may be longer than the first side of the second region. The header circuits may provide power to the interface circuits through metal rails extending in parallel with the first side of the second region. Accordingly, the metal rails extending in parallel with the first side of the second region may have a shorter length than metal rails extending in parallel with the second side of the second region. Hence, the metal rails extending in parallel with the first side of the second region may have low resistances. By reducing resistances of the metal rails, power efficiency can be achieved.

In one aspect, the header circuits can achieve area efficiency. Different header circuits may provide different power or voltages to different portions of the interface circuits. Different header circuits may be elongated in parallel with the second side of the second region, and share a same well structure (e.g., N-well). By sharing the same well structure, the header circuits may be disposed in a compact form to achieve area efficiency.

Figure 9:
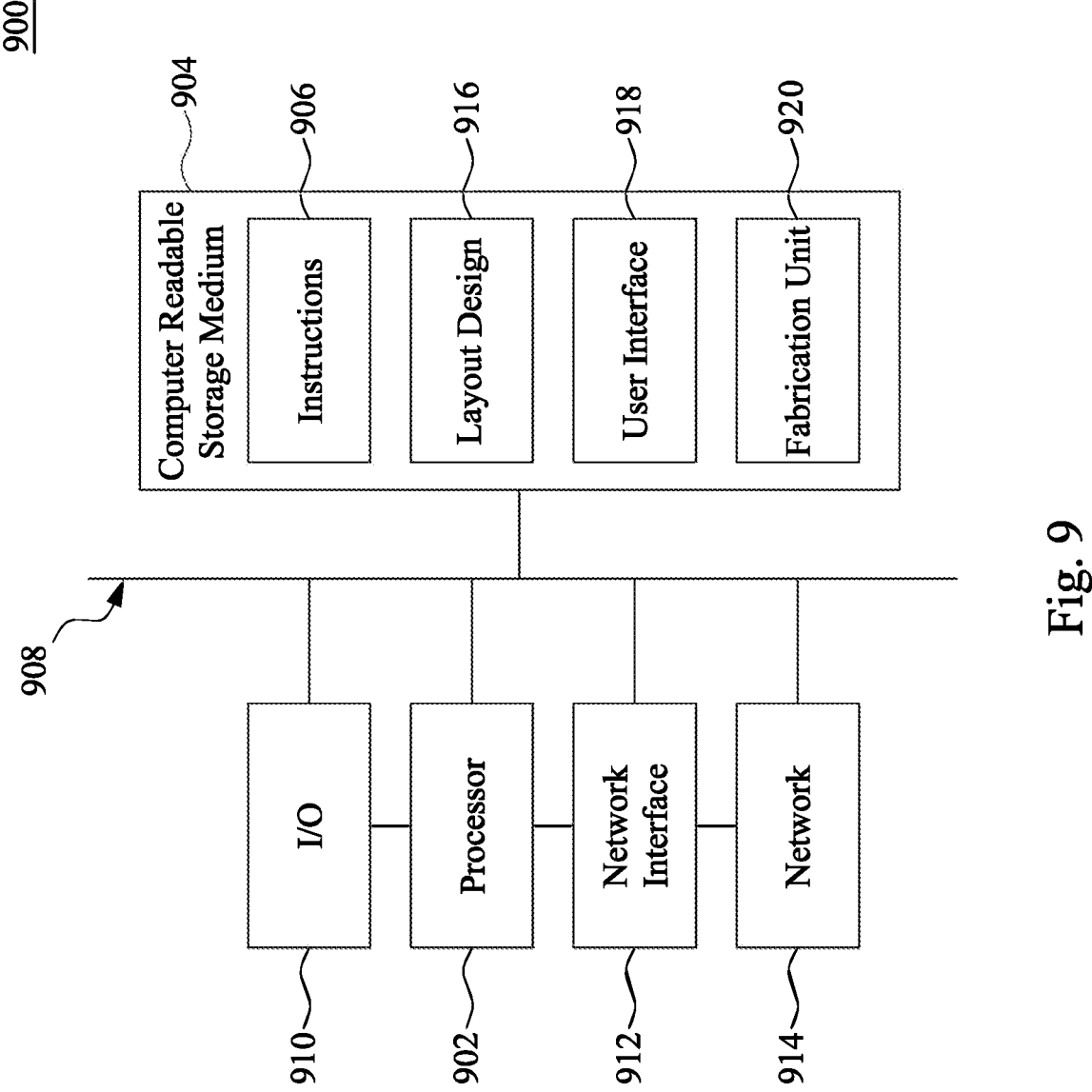
FIG. 9 is a block diagram of a system of generating an IC layout design, in accordance with some embodiments.

FIG. 9 is a schematic view of a system 900 for designing and manufacturing an IC layout design in accordance with some embodiments. In some embodiments, system 900 generates or places one or more IC layout designs described herein. In some embodiments, the system 900 manufactures one or more ICs based on the one or more IC layout designs described herein. The system 900 includes a hardware processor 902 and a non-transitory, computer readable storage medium 904 encoded with, e.g., storing, the computer program code 906, e.g., a set of executable instructions. Computer readable storage medium 904 is configured for interfacing with manufacturing machines for producing the integrated circuit. The processor 902 is electrically coupled to the computer readable storage medium 904 by a bus 908. The processor 902 is also electrically coupled to an I/O interface 910 by bus 908. A network interface 912 is also electrically connected to the processor 902 by bus 908. Network interface 912 is connected to a network 914, so that processor 902 and computer readable storage medium 904 are capable of connecting to external elements via network 914. The processor 902 is configured to execute the computer program code 906 encoded in the computer readable storage medium 904 in order to cause system 900 to be usable for performing a portion or all of the operations as described in method 800.

In some embodiments, the processor 902 is a central processing unit (CPU), a multi-processor, a distributed processing system, an application specific integrated circuit (ASIC), and/or a suitable processing unit.

In some embodiments, the computer readable storage medium 904 is an electronic, magnetic, optical, electromagnetic, infrared, and/or a semiconductor system (or apparatus or device). For example, the computer readable storage medium 904 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 904 includes a compact disk-read only memory (CD-ROM), a compact disk-read/write (CD-R/W), and/or a digital video disc (DVD).

In some embodiments, the storage medium 904 stores the computer program code 906 configured to cause system 900 to perform method 800. In some embodiments, the storage medium 904 also stores information needed for performing method 800 as well as information generated during performance of method 800, such as layout design 916 and user interface 918 and fabrication unit 920, and/or a set of executable instructions to perform the operation of method 800.

In some embodiments, the storage medium 904 stores instructions (e.g., computer program code 906) for interfacing with manufacturing machines. The instructions (e.g., computer program code 906) enable processor 902 to generate manufacturing instructions readable by the manufacturing machines to effectively implement method 800 during a manufacturing process.

System 900 includes I/O interface 910. I/O interface 910 is coupled to external circuitry. In some embodiments, I/O interface 910 includes a keyboard, keypad, mouse, trackball, trackpad, and/or cursor direction keys for communicating information and commands to processor 902.

System 900 also includes network interface 912 coupled to the processor 902. Network interface 912 allows system 900 to communicate with network 914, to which one or more other computer systems are connected. Network interface 912 includes wireless network interfaces such as BLUETOOTH, WIFI, WIMAX, GPRS, or WCDMA; or wired network interface such as ETHERNET, USB, or IEEE-13154. In some embodiments, method 800 is implemented in two or more systems 900, and information such as layout design, user interface and fabrication unit are exchanged between different systems 900 by network 914.

System 900 is configured to receive information related to a layout design through I/O interface 910 or network interface 912. The information is transferred to processor 902 by bus 908 to determine a layout design for producing an IC. The layout design is then stored in computer readable medium 904 as layout design 916. System 900 is configured to receive information related to a user interface through I/O interface 910 or network interface 912. The information is stored in computer readable medium 904 as user interface 918. System 900 is configured to receive information related to a fabrication unit through I/O interface 910 or network interface 912. The information is stored in computer readable medium 904 as fabrication unit 920. In some embodiments, the fabrication unit 920 includes fabrication information utilized by system 900.

In some embodiments, method 800 is implemented as a standalone software application for execution by a processor. In some embodiments, method 800 is implemented as a software application that is a part of an additional software application. In some embodiments, method 800 is implemented as a plug-in to a software application. In some embodiments, method 800 is implemented as a software application that is a portion of an EDA tool. In some embodiments, method 800 is implemented as a software application that is used by an EDA tool. In some embodiments, the EDA tool is used to generate a layout design of the integrated circuit device. In some embodiments, the layout design is stored on a non-transitory computer readable medium. In some embodiments, the layout design is generated using a tool such as VIRTUOSO® available from CADENCE DESIGN SYSTEMS, Inc., or another suitable layout generating tool. In some embodiments, the layout design is generated based on a netlist which is created based on the schematic design. In some embodiments, method 800 is implemented by a manufacturing device to manufacture an integrated circuit using a set of masks manufactured based on one or more layout designs generated by system 900. In some embodiments, system 900 is a manufacturing device (e.g., fabrication tool 922) to manufacture an integrated circuit using a set of masks manufactured based on one or more layout designs of the present disclosure. In some embodiments, system 900 of FIG. 9 generates layout designs of an IC that are smaller than other approaches. In some embodiments, system 900 of FIG. 9 generates layout designs of an IC that occupy less area than other approaches.

Figure 10:
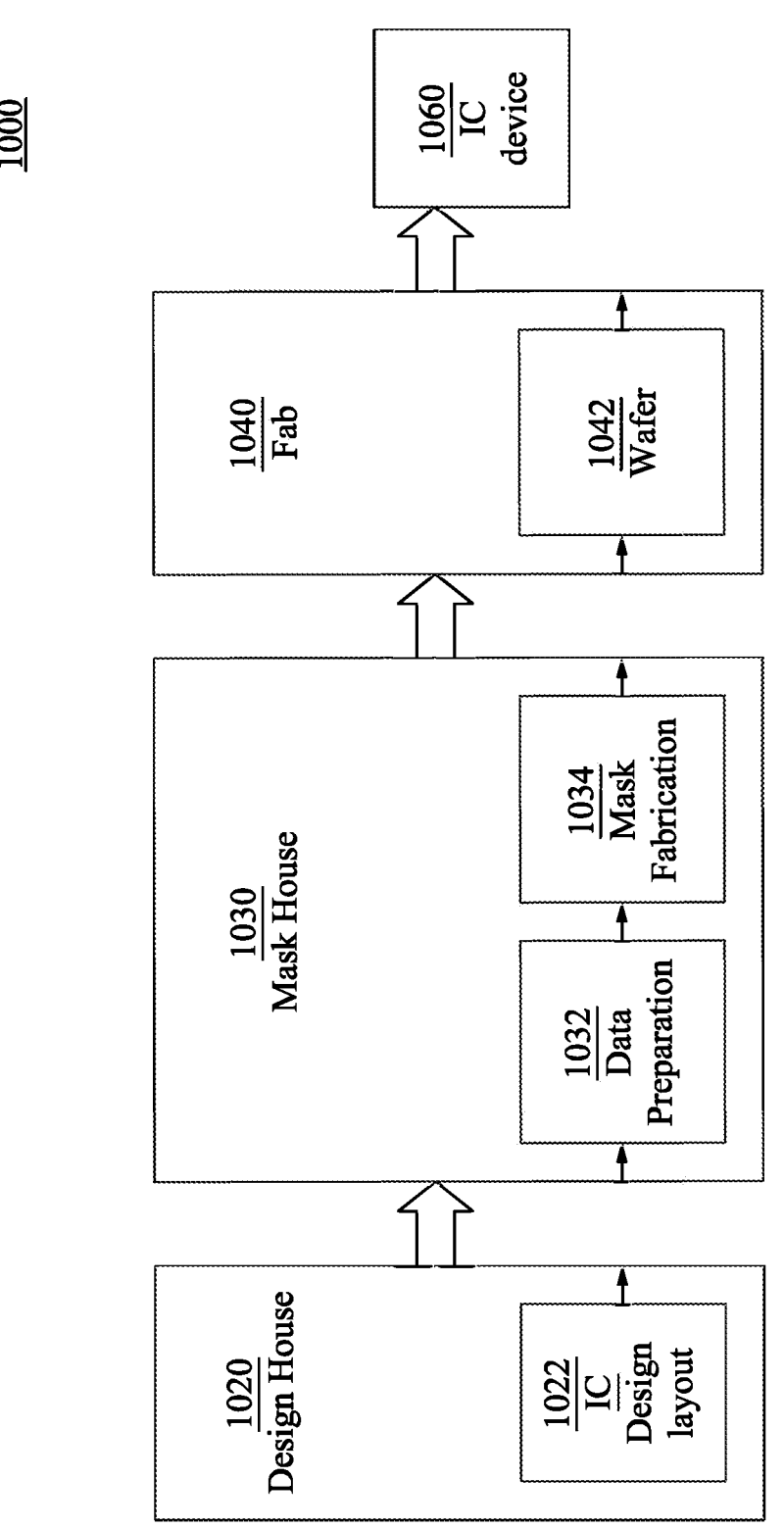
FIG. 10 is a block diagram of an IC manufacturing system, and an IC manufacturing flow associated therewith, in accordance with at least one embodiment of the present disclosure.

FIG. 10 is a block diagram of an integrated circuit (IC) manufacturing system 1000, and an IC manufacturing flow associated therewith, in accordance with at least one embodiment of the present disclosure.

In FIG. 10, IC manufacturing system 1000 includes entities, such as a design house 1020, a mask house 1030, and an IC manufacturer/fabricator ("fab") 1040, that interact with one another in the design, development, and manufacturing cycles and/or services related to manufacturing an IC device 1060. The entities in system 1000 are connected by a communications network. In some embodiments, the communications network is a single network. In some embodiments, the communications network is a variety of different networks, such as an intranet and the Internet. The communinications network includes wired and/or wireless communication channels. Each entity interacts with one or more of the other entities and provides services to and/or receives services from one or more of the other entities. In some embodiments, two or more of design house 1020, mask house 1030, and IC fab 1040 is owned by a single company. In some embodiments, two or more of design house 1020, mask house 1030, and IC fab 1040 coexist in a common facility and use common resources.

Design house (or design team) 1020 generates an IC design layout 1022. IC design layout 1022 includes various geometrical patterns designed for an IC device 1060. The geometrical patterns correspond to patterns of metal, oxide, or semiconductor layers that make up the various components of IC device 1060 to be fabricated. The various layers combine to form various IC features. For example, a portion of IC design layout 1022 includes various IC features, such as an active region, gate structure, source structure and drain structure, metal lines or via contacts of an interlayer interconnection, and openings for bonding pads, to be formed in a semiconductor substrate (such as a silicon wafer) and various material layers disposed on the semiconductor substrate. Design house 1020 implements a proper design procedure to form IC design layout 1022. The design procedure includes one or more of logic design, physical design or place and route. IC design layout 1022 is presented in one or more data files having information of the geometrical patterns. For example, IC design layout 1022 can be expressed in a GDSII file format or DFII file format.

Mask house 1030 includes mask data preparation 1032 and mask fabrication 1034. Mask house 1030 uses IC design layout 1022 to manufacture one or more masks to be used for fabricating the various layers of IC device 1060 according to IC design layout 1022. Mask house 1030 performs mask data preparation 1032, where IC design layout 1022 is translated into a representative data file ("RDF"). Mask data preparation 1032 provides the RDF to mask fabrication 1034. Mask fabrication 1034 includes a mask writer. A mask writer converts the RDF to an image on a substrate, such as a mask (reticle) or a semiconductor wafer. The design layout is manipulated by mask data preparation 1032 to comply with particular characteristics of the mask writer and/or requirements of IC fab 1040. In FIG. 10, mask data preparation 1032 and mask fabrication 1034 are illustrated as separate elements. In some embodiments, mask data preparation 1032 and mask fabrication 1034 can be collectively referred to as mask data preparation.

In some embodiments, mask data preparation 1032 includes optical proximity correction (OPC) which uses lithography enhancement techniques to compensate for image errors, such as those that can arise from diffraction, interference, other process effects and the like. OPC adjusts IC design layout 1022. In some embodiments, mask data preparation 1032 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1032 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 1034, which may undo part of the modifications performed by OPC in order to meet mask creation rules.

In some embodiments, mask data preparation 1032 includes lithography process checking (LPC) that simulates processing that will be implemented by IC fab 1040 to fabricate IC device 1060. LPC simulates this processing based on IC design layout 1022 to create a simulated manufactured device, such as IC device 1060. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC can be repeated to further refine IC design layout 1022.

It should be understood that the above description of mask data preparation 1032 has been simplified for the purposes of clarity. In some embodiments, mask data preparation 1032 includes additional features such as a logic operation (LOP) to modify the IC design layout according to manufacturing rules. Additionally, the processes applied to IC design layout 1022 during mask data preparation 1032 may be executed in a variety of different orders.

After mask data preparation 1032 and during mask fabrication 1034, a mask or a group of masks are fabricated based on the modified IC design layout. In some embodiments, an electron-beam (e-beam) or a mechanism of multiple e-beams is used to form a pattern on a mask (photomask or reticle) based on the modified IC design layout. The mask can be formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM. The mask(s) generated by mask fabrication 1034 is used in a variety of processes. For example, such a mask(s) is used in an ion implantation process to form various doped regions in the semiconductor wafer, in an etching process to form various etching regions in the semiconductor wafer, and/or in other suitable processes.

IC fab 1040 is an IC fabrication entity that includes one or more manufacturing facilities for the fabrication of a variety of different IC products. In some embodiments, IC fab 1040 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL)

fabrication), and a third manufacturing facility may provide other services for the foundry entity.

IC fab 1040 uses the mask (or masks) fabricated by mask house 1030 to fabricate IC device 1060. Thus, IC fab 1040 at least indirectly uses IC design layout 1022 to fabricate IC device 1060. In some embodiments, a semiconductor wafer 1042 is fabricated by IC fab 1040 using the mask (or masks) to form IC device 1060. Semiconductor wafer 1042 includes a silicon substrate or other proper substrate having material layers formed thereon. Semiconductor wafer further includes one or more of various doped regions, dielectric features, multilevel interconnects, and the like (formed at subsequent manufacturing steps).

System 1000 is shown as having design house 1020, mask house 1030 or IC fab 1040 as separate components or entities. However, it is understood that one or more of design house 1020, mask house 1030 or IC fab 1040 are part of the same component or entity.

Details regarding an integrated circuit (IC) manufacturing system (e.g., system 1000 of FIG. 10), and an IC manufacturing flow associated therewith are found, e.g., in U.S. Pat. No. 9,256,709, granted Feb. 9, 2016, U.S. Patent Application Publication No. 20150278429, published Oct. 1, 2015, U.S. Patent Application Publication No. 20100040838, published Feb. 6, 2014, and U.S. Pat. No. 7,260,442, granted Aug. 21, 2007, the entireties of each of which are hereby incorporated by reference.

One aspect of this description relates to an integrated circuit including a first layer, a second layer, and a third layer. In some embodiments, the first layer includes a set of metal rails. In some embodiments, the second layer is disposed above the first layer along a first direction. In some embodiments, the second layer includes a first region, a second region, and a third region. In some embodiments, the first region corresponds to a circuit array. The circuit array may be a memory array including memory cells. In some embodiments, the second region corresponds to a set of interface circuits to operate the circuit array. In some embodiments, a side of the first region faces a first side of the second region along a second direction perpendicular to the first direction. In some embodiments, the third region corresponds to a set of header circuits to provide power from the set of metal rails to the set of interface circuits. In some embodiments, a side of the third region faces a second side of the second region along a third direction orthogonal to the first direction and the second direction. In some embodiments, the third layer is disposed above the second layer along the first direction. In some embodiments, the third layer includes another set of metal rails to electrically connect the set of interface circuits.

One aspect of this description relates to an integrated circuit including a semiconductor layer. In some embodiments, the semiconductor layer includes a first region, a second region, and a third region. In some embodiments, the first region corresponds to a circuit array. In some embodiments, the second region corresponds to a set of interface circuits to operate the circuit array. In some embodiments, a side of the first region faces a first side of the second region along a first direction. In some embodiments, the third region corresponds to a set of header circuits to provide power to the set of interface circuits through a set of metal rails extending along a second direction traversing the first direction. In some embodiments, a side of the third region faces a second side of the second region along the second direction. In some embodiments, the first side of the second region extending along the second direction is shorter than the second side of the second region extending along the first direction. In some embodiments, the set of metal rails extending along the second direction is shorter than the first side of the second region.

One aspect of this description relates to an integrated circuit including a semiconductor layer. In some embodiments, the semiconductor layer includes a first region, a second region, and a third region. In some embodiments, the first region corresponding to a circuit array. In some embodiments, the second region corresponds to a set of interface circuits to operate the circuit array. In some embodiments, a side of the first region faces a first side of the second region along a first direction. In some embodiments, the third region corresponds to a set of header circuits to provide power to the set of interface circuits through metal rails extending along a second direction. In some embodiments, a side of the third region faces a second side of the second region along the second direction. In some embodiments, the set of header circuits includes a first header circuit to provide a first voltage to a first subset of the set of interface circuits. In some embodiments, the set of header circuit includes a switch rail header circuit to selectively provide one of the first voltage or a second voltage to a second subset of the set of interface circuits. In some embodiments, the first header circuit and the switch rail header circuit share a well structure (e.g., N-well).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
a first layer including:
    a circuit array;
    a plurality of interface circuits operatively coupled to the circuit array, wherein the plurality of interface circuits are arranged next to the circuit array along a first lateral direction; and
    a plurality of header circuits each configured to receive power from a set of metal rails formed in a second layer different from the first layer and each configured to provide the power to the interface circuits, wherein each of the plurality of header circuits is arranged next to a corresponding one of the plurality of interface circuits along a second lateral direction perpendicular to the first lateral direction.

2. The integrated circuit of claim 1, wherein the first layer and the second layer are formed on respectively opposite sides of a substrate.

3. The integrated circuit of claim 1, wherein the header circuits include at least one first header circuit configured to provide a first voltage to a first subset of the interface circuits.

4. The integrated circuit of claim 3, wherein the header circuits include a switch rail header circuit to selectively provide one of the first voltage or a second voltage to a second subset of the interface circuits.

5. The integrated circuit of claim 4, wherein the first header circuit and the switch rail header circuit share a well structure.

6. The integrated circuit of claim 4, wherein a first width of the first header circuit along the second lateral direction is different than a second width of the switch rail header circuit along the second lateral direction.

7. The integrated circuit of claim 4, wherein the first voltage is different from the second voltage.

8. The integrated circuit of claim 3, wherein the circuit array is a memory array including a plurality of memory cells.

9. The integrated circuit of claim 3, wherein the circuit array, the interface circuits, and the header circuits each include a plurality of gate all around field effect transistors (GAAFETs).

10. An integrated circuit, comprising:
a first layer disposed on a first side of a substrate; and
a second layer disposed on a second side of the substrate, the second side being opposite to the first side;
wherein the second layer includes a set of metal rails; and
wherein the first layer includes:
    a first region configured to form a circuit array;
    a second region configured to form a first interface circuit operatively coupled to the circuit array;
    a third region disposed next the second region along a first lateral direction and configured to form a second interface circuit operatively coupled to the circuit array, wherein both of the second region and third region are arranged next to the first region along the first lateral direction; and
    a fourth region configured to form a plurality of header circuits to receive power from the set of metal rails in the second layer, wherein the header circuits are configured to provide a first voltage and a second voltage to the first interface circuit and the second interface circuit, respectively, and wherein the fourth region is arranged next to both of the second region and third region along a second lateral direction perpendicular to the first lateral direction.

11. The integrated circuit of claim 10, wherein the circuit array is a memory array including a plurality of memory cells.

12. The integrated circuit of claim 10, wherein the first voltage is different from the second voltage.

13. The integrated circuit of claim 10, wherein the circuit array, the first interface circuit, the second interface circuit, and the header circuits each include a plurality of gate all around field effect transistors (GAAFETs).

14. The integrated circuit of claim 10, wherein a side of the first region faces a first side of each of the second region and third region along the first lateral direction.

15. The integrated circuit of claim 14, wherein a side of the fourth regions faces a second side of each of the second region and the third region along the second lateral direction.

16. An integrated circuit, comprising:
a first layer disposed on a first side of a substrate; and
a second layer disposed on a second side of the substrate, the second side being opposite to the first side;
wherein the second layer includes a set of metal rails; and
wherein the first layer includes:
    a first region configured to form a memory array including a plurality of memory cells;
    a second region configured to form a first interface circuit operatively coupled to the circuit array;
    a third region disposed next the second region along a first lateral direction and configured to form a second interface circuit operatively coupled to the circuit array, wherein both of the second region and third region are arranged next to the first region along the first lateral direction; and a fourth region configured to form a plurality of header 5 circuits to receive power from the set of metal rails in the second layer, wherein the header circuits are configured to provide a first voltage and a second voltage to the first interface circuit and the second interface circuit, respectively, and wherein the fourth 10 region is arranged next to both of the second region and third region along a second lateral direction perpendicular to the first lateral direction.

17. The integrated circuit of claim 16, wherein the circuit array, the first interface circuit, the second interface circuit, 15 and the header circuits each include a plurality of gate all around field effect transistors (GAAFETs).

18. The integrated circuit of claim 16, wherein the first voltage is different from the second voltage.

19. The integrated circuit of claim 16, wherein a side of 20 the first region faces a first side of each of the second region and third region along the first lateral direction.

20. The integrated circuit of claim 19, wherein a side of the fourth regions faces a second side of each of the second region and the third region along the second lateral direction. 25

* * * * *